(12) United States Patent
Chen (10) Patent No.: US 11,778,855 B2
(45) Date of Patent: Oct. 3, 2023

(54) LIGHT-EMITTING DIODE STRUCTURE, FABRICATION METHOD THEREFOR, AND DISPLAY PANEL

(71) Applicant: BOE TECHNOLOGY GROUP CO., LTD., Beijing (CN)

(72) Inventor: Zhuo Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 365 days.

(21) Appl. No.: 17/043,163

(22) PCT Filed: Jul. 26, 2019

(86) PCT No.: PCT/CN2019/097896
§ 371 (c)(1),
(2) Date: Sep. 29, 2020

(87) PCT Pub. No.: WO2020/020341
PCT Pub. Date: Jan. 30, 2020

(65) Prior Publication Data
US 2021/0193876 A1     Jun. 24, 2021

(30) Foreign Application Priority Data

Jul. 26, 2018 (CN) .......................... 201810834313.5

(51) Int. Cl.
*H10K 50/854* (2023.01)
*H01L 25/075* (2006.01)
(Continued)

(52) U.S. Cl.
CPC ....... *H10K 50/854* (2023.02); *H01L 25/0753* (2013.01); *H01L 33/06* (2013.01); *H01L 33/14* (2013.01); *H01L 33/382* (2013.01); *H10K 50/115* (2023.02); *H10K 50/15* (2023.02); *H10K 50/16* (2023.02); *H10K 50/17* (2023.02);
(Continued)

(58) Field of Classification Search
CPC ........ H01L 33/06; H01L 33/14; H01L 33/382
See application file for complete search history.

(56) References Cited

U.S. PATENT DOCUMENTS 9,502,691 B2   11/2016   Zhang
10,038,159 B2   7/2018   Huang
(Continued)

FOREIGN PATENT DOCUMENTS

CN    103219433 A    7/2013
CN    103715372 A    4/2014
(Continued)

OTHER PUBLICATIONS

First Chinese Office Action from Chinese Patent Application No. 201810834313.5 dated Oct. 24, 2019.

*Primary Examiner* — Mark W Tornow
(74) *Attorney, Agent, or Firm* — Dilworth & Barrese, LLP.; Michael J. Musella, Esq.

(57) ABSTRACT

A light-emitting diode structure, a fabrication method therefor, and a display panel. The light-emitting diode structure includes: a base substrate; and a first electrode layer, a light-emitting layer and a second electrode layer that are successively stacked on the base substrate, wherein the second electrode layer includes a first coarse surface that is located at a side far from the base substrate.

6 Claims, 7 Drawing Sheets

(51) Int. Cl.
*H01L 33/06* (2010.01)
*H01L 33/14* (2010.01)
*H01L 33/38* (2010.01)
*H10K 50/15* (2023.01)
*H10K 50/16* (2023.01)
*H10K 50/17* (2023.01)
*H10K 50/115* (2023.01)
*H10K 50/818* (2023.01)
*H10K 50/822* (2023.01)
*H10K 50/828* (2023.01)
*H10K 71/00* (2023.01)
*H10K 102/10* (2023.01)
*H10K 102/00* (2023.01)

(52) U.S. Cl.
CPC ......... *H10K 50/818* (2023.02); *H10K 50/822* (2023.02); *H10K 50/828* (2023.02); *H10K 71/00* (2023.02); *H10K 71/621* (2023.02); *H01L 2933/0016* (2013.01); *H10K 2102/103* (2023.02); *H10K 2102/3026* (2023.02)

(56) References Cited

U.S. PATENT DOCUMENTS

| | | | |
|---|---|---|---|
| 2012/0126263 A1* | 5/2012 | Chao | H01L 51/5271 257/98 |
| 2013/0019937 A1* | 1/2013 | So | H01L 51/442 257/E31.026 |
| 2015/0060840 A1* | 3/2015 | Nishimura | H05B 33/28 257/40 |
| 2019/0119569 A1* | 4/2019 | Lee | C01B 19/007 |
| 2020/0035953 A1 | 1/2020 | Chen | |
| 2020/0388782 A1 | 12/2020 | Chen et al. | |

FOREIGN PATENT DOCUMENTS

| | | |
|---|---|---|
| CN | 105161632 A | 12/2015 |
| CN | 105742449 A | 7/2016 |
| CN | 106449719 A | 2/2017 |
| CN | 207183320 U | 4/2018 |
| CN | 108321312 A | 7/2018 |
| CN | 108922984 A | 11/2018 |
| JP | 2002217451 A | 8/2002 |
| KR | 20130089395 A | 8/2013 |

\* cited by examiner

LIGHT-EMITTING DIODE STRUCTURE, FABRICATION METHOD THEREFOR, AND DISPLAY PANEL

CROSS REFERENCE TO RELATED APPLICATIONS

The present application claims priority of Chinese Patent Application No. 201810834313.5 filed on Jul. 26, 2018, entitled "DISPLAY PANEL AND PREPARATION METHOD THEREOF, AND DISPLAY DEVICE", the disclosure of which is incorporated herein by reference in its entirety as part of the present application.

TECHNICAL FIELD

Embodiments of the present disclosure relate to a light-emitting diode structure and a fabrication method therefor, and a display panel.

BACKGROUND

With further development of a Quantum dot Light-Emitting Diode (QLED) display device, stability and light-emitting efficiency of quantum dots are also continuously promoted, so that the QLED display device gradually becomes an important part in the field of display; however, in an QLED display device adopting a top-emitting structure, due to a narrow spectrum of the quantum dots, an effective range of microcavity regulation and control is also relatively narrow, which often may cause loss of light-emitting energy of a QLED and may reduce light-emitting efficiency and influence quality of the QLED display device.

SUMMARY

Embodiments of the present disclosure provide a light-emitting diode structure and a fabrication method therefor, and a display panel.

According to a first aspect of the present disclosure, provided is a light-emitting diode structure, including:

a base substrate;

a first electrode layer, a light-emitting layer and a second electrode layer which are sequentially stacked on the base substrate, wherein the second electrode layer includes a first rough surface located on a side away from the base substrate.

According to a first aspect of the present disclosure, provided is a display panel, including the light-emitting diode structure described above.

According to a first aspect of the present disclosure, provided is a fabrication method of a light-emitting diode structure, including:

providing a base substrate;

sequentially forming a first electrode layer and a light-emitting layer on the base substrate;

arranging a first mask and a second mask which are stacked with each other on a side of the light-emitting layer facing away from the base substrate, a spacing being set between the first mask and the second mask; and forming a second electrode layer on the base substrate on which the first electrode layer and the light-emitting layer are formed by adopting the first mask and the second mask.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise specified, the technical terms or scientific terms used in the present disclosure should be of general meaning as understood by those ordinarily skilled in the art. In the disclosure, words such as "first", "second" and the like do not denote any order, quantity, or importance, but rather are used for distinguishing different components. Similarly, words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position of the described object is changed, the relative positional relationship may also be correspondingly changed.

With further development of a quantum dot preparation technology, stability and light-emitting efficiency of quantum dots are continuously promoted, research on a QLED is constantly deepened, and the application prospect of the QLED in the field of display becomes brighter day by day. However, currently, research on the QLED is mostly related to a bottom-emitting structure. In a top-emitting OLED device, a translucent metal is adopted as a top electrode and has a strong microcavity effect, and thus, luminous efficiency of a top-emitting QLED is relatively low.

Figure 1A:
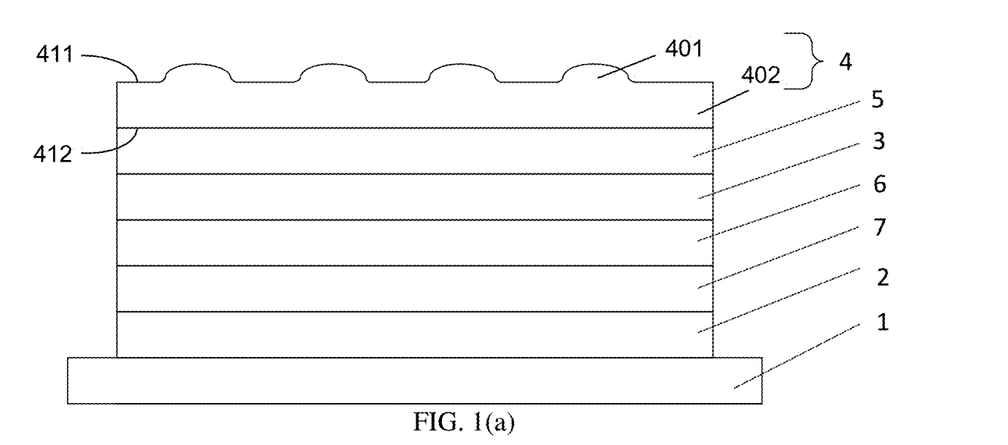
FIG. 1(a) is a structural schematic diagram of an upright light-emitting diode structure provided by an embodiment of the present disclosure.
Figure 2:
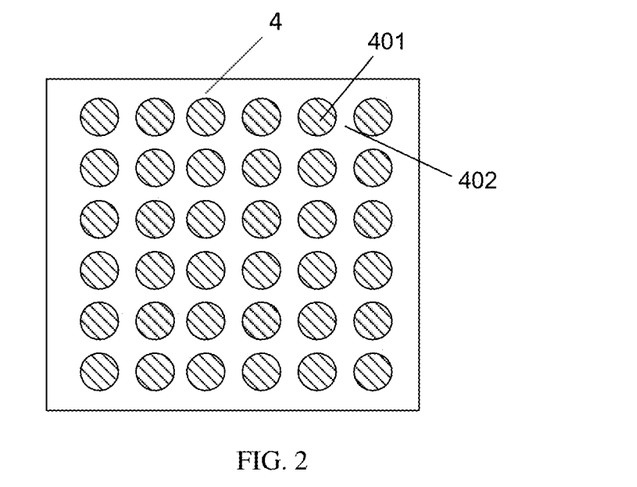
FIG. 2 is a top view of a second electrode layer provided by an embodiment of the present disclosure.

As shown in FIG. 1(a) and FIG. 2, an embodiment of the present disclosure provides a light-emitting diode structure, including: a base substrate 1; and a first electrode layer 2, a light-emitting layer 3 and a second electrode layer 4 which are sequentially stacked on the base substrate 1, wherein the second electrode layer 4 includes a first rough surface 411 located on the side away from the base substrate 1. The surface of the second electrode layer 4 on the side away from the base substrate 1 is a rough surface, and thus, an incident angle of light after the light passes through the rough surface can be changed, and all the light emitted by the light-emitting layer 3 can penetrate the second electrode layer 4 to be emitted, so that luminous efficiency of a display panel is improved.

For example, as shown in FIG. 1, the second electrode layer 4 further includes a second rough surface 412 on the side close to the light emitting layer, wherein roughness of the second rough surface 412 is smaller than roughness of the first rough surface 411. For example, the roughness of the first rough surface 411 is more than one thousand times of the roughness of the second rough surface 412. Therefore, light transmitting a transport layer 5 passes through the surface 412 with low roughness to arrive at the surface 411 with high roughness, the incident angle can be obviously changed, and a probability of total reflection of incident light is reduced, so that as much light as possible emerges from the second electrode layer 4. For example, the roughness of the first rough surface 411 is greater than or equal to 10 microns, e.g., 20 microns, 30 microns, 40 microns and the like; and the roughness of the second rough surface 412 is smaller than 10 nanometers, e.g., 8 nanometers, 5 nanometers, 3 nanometers and the like.

Figure 1B:
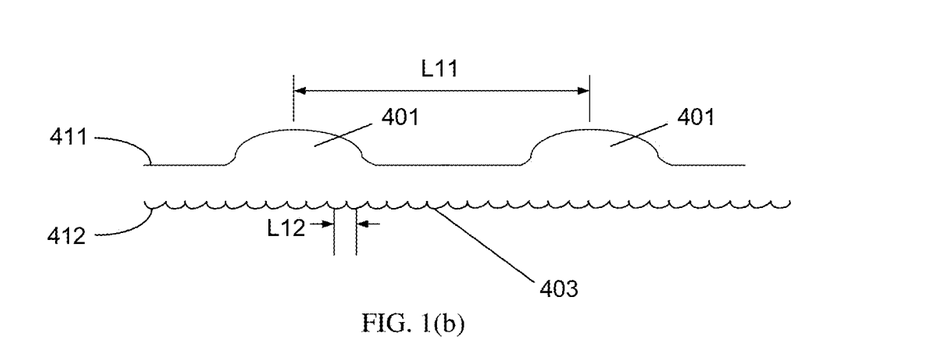
FIG. 1(b) is a partially enlarged sectional schematic diagram of a second electrode layer provided by an embodiment of the present disclosure.

For example, the first rough surface has a plurality of protrusions, a size of an orthogonal projection of each protrusion in a plane where the base substrate is located is 10 microns to 100 microns. As shown in FIG. 1(b) and FIG. 2, the first rough surface 411 has a plurality of first protrusions 401, the orthogonal projection of the protrusion 401 on the plane where the base substrate is located is of a circle, and a diameter of the circle is 10 microns to 100 microns. For example, the plurality of first protrusions 401 is arranged in an equal spacing manner, and a distance L11 between peaks of two adjacent first protrusions 401 is 40 microns to 60 microns. Therefore, the rough surface formed by the plurality of protrusions 401 is of a periodically arranged concave-convex structure, so that a fabricating process can be simplified, and brightness uniformity of the display panel can be improved. For example, a height of the first protrusion 401 is 10 nanometers to 50 nanometers, and a thickness of the second electrode layer is 100 nanometers to 300 nanometers.

It should be understood that the orthogonal projection of the first protrusion 401 on the plane where the base substrate is located may also be of a regular shape such as a square, a regular polygon and an oval, or be of an irregular shape; the shape of the first protrusion 401 is determined by a shape of an opening of a second mask in a preparation process, and the present disclosure does not make any limit thereto. The height of the protrusion 401 is influenced by sputtering time and a distance between the second mask and the substrate.

For example, as shown in FIG. 1(b), the second rough surface 412 has a plurality of second protrusions 403, nearly no gap is formed between the second protrusions 403, and a distance L12 between peaks of two adjacent second protrusions 403 is smaller than or equal to 10 nm, and thus, the second rough surface 412 with low roughness is formed.

In at least some embodiments, the light-emitting diode structure further includes a first transport layer located on a side of the light-emitting layer close to the second electrode layer. For example, as shown in FIG. 1, it shows an upright light-emitting diode structure, wherein the second electrode layer 4 is adopted as a cathode layer, and the first electrode layer 2 is adopted as an anode layer. In this case, an electron transport layer 5 is arranged on the side of the light-emitting layer 3 close to the second electrode layer 4. The electron transport layer 5 is in direct contact with the second rough surface 412 of the second electrode layer 4. For example, the second electrode layer 4 is prepared from a transparent conductive oxide. The transparent conductive oxide includes, but is not limited to, an Indium Tin Oxide (ITO), an Indium Zinc Oxide (IZO), an aluminium-doped zinc oxide (AZO) and an Indium Gallium Zinc Oxide (IGZO), and the electron transport layer 5 includes metal oxide nanoparticles, e.g., Zinc Oxide (ZnO) nanoparticles. By using the transparent conductive oxide with high transparency as the cathode layer, the microcavity effect can be reduced greatly. In addition, by using the ZnO nanoparticles as the electron transport layer, damage to the device when electrode is produced by a magnetron sputtering method can be prevented. The light-emitting diode structure in FIG. 1 further includes a hole transport layer 6 and a hole injection layer 7 which are arranged on a side of the light-emitting layer 3 close to the first electrode layer 2. The hole transport layer 6 and the hole injection layer 7 can adopt a conventional material in the art, which is not repeated herein. In this embodiment, the anode layer includes a reflective metal or a combination of a reflective metal and the transparent conductive oxide, e.g., Ag, Al, Ag/ITO, Al/ITO, ITO/Ag/ITO and ITO/Al/ITO. Optionally, the first electrode layer 2 can be a metal electrode film, and the metal electrode film not only can be adopted as an anode of a power supply, but also can take a reflecting effect on light, so that the light emitted by the light-emitting layer 3 can be reflected by the first electrode layer 2 after being irradiated to the first electrode layer 2, thereby improving the luminous efficiency of the display panel.

Figure 3:
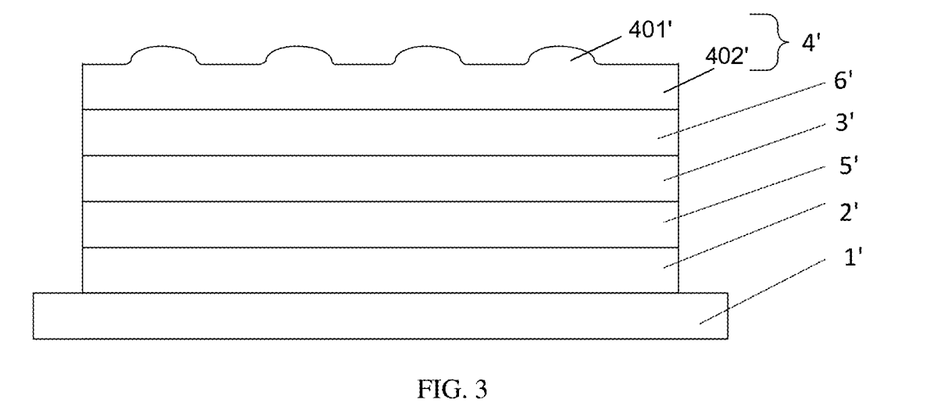
FIG. 3 is a structural schematic diagram of an inverted light-emitting diode structure provided by an embodiment of the present disclosure.

For example, FIG. 3 shows an inverted light-emitting diode structure, wherein a second electrode layer 4' has a first rough surface 401' and a second rough surface 402', the second electrode layer 4' is adopted as an anode layer, and a first electrode layer 2' is adopted as a cathode layer. In this case, a hole transport layer 6' is arranged on a side of a light-emitting layer 3' is close to the second electrode layer 4'. The hole transport layer 6' is in direct contact with the second rough surface 412' of the second electrode layer 4'. For example, the second electrode layer 4' is prepared from a transparent conductive oxide. The transparent conductive oxide includes, but is not limited to, the ITO, the IZO, the AZO and the IGZO, and the hole transport layer 6' includes metal oxide nanoparticles, e.g., Nickel Oxide (NiO) nanoparticles, or includes an inorganic material, e.g., HAT-CN (Dipyrazino[2,3-f:2',3'-h]quinoxaline-2,3,6,7,10,11-hexacarbonitrile). By using the transparent conductive oxide with high transparency as the anode layer, the microcavity effect can be reduced greatly. In addition, by using the NiO nanoparticles or the organic material as the hole transport layer, damage to the device when electrode is produced by the magnetron sputtering method can be prevented. In the embodiments of the present disclosure, in this embodiment, the cathode layer includes a reflective metal or a combination of a reflective metal and the transparent conductive oxide, e.g., Ag, Al, Ag/ITO, Al/ITO, ITO/Ag/ITO and ITO/Al/ITO. The light-emitting diode structure in FIG. 3 further includes an electron transport layer 5' arranged on a side of the light-emitting layer 3' close to the first electrode layer 2'.

In the embodiments of the present disclosure, the base substrates 1, 1' are adopted as support bases of the light-emitting diode structures, and can be adopted as setting carriers for other functional layers in the light-emitting diode structure. Optionally, the base substrate 1 can be a glass substrate. The light-emitting layers 3, 3' may consist of a light-emitting material, for example, the light-emitting layer 3 may be prepared from a quantum dot material, a quantum dot is a nano-level semiconductor, and by applying a certain electric field or voltage to the quantum dot, the quantum dot can emit light with a specific frequency so as to be adopted as a light source of the display panel. When the first electrode layers 2, 2' and the second electrode layers 4, 4' are powered on, the electric field can be formed between the first electrode layers 2, 2' and the second electrode layers 4, 4', and under the action of the electric field, the light-emitting layer 3 can emit light.

An embodiment of the present disclosure further provides a display panel, including the light-emitting diode structure according to any one of the above-mentioned embodiments.

For example, the display panel is a QLED display panel. In the prior art, both upper and lower surfaces of a top electrode in the QLED display panel are flat or smooth surfaces, and when light emitted by the light-emitting layer passes through the top electrode, part of the light can be fully reflected in the top electrode due to the reason of an angle, and thus cannot emerge from the top electrode, resulting in that the luminous efficiency of the display panel can be reduced and quality of a display device is influenced.

Compared to the prior art, in the display panel provided by the embodiment of the present disclosure, a surface of the second electrode layer (i.e., the top electrode) on the side away from the base substrate is a rough surface, and thus, after the light passes through the rough surface, an incident angle can be changed, and all the light emitted by the light-emitting layer can penetrate the second electrode layer to emerge, so that the luminous efficiency of the display panel can be improved, and quality of a display apparatus is ensured.

Figure 4:
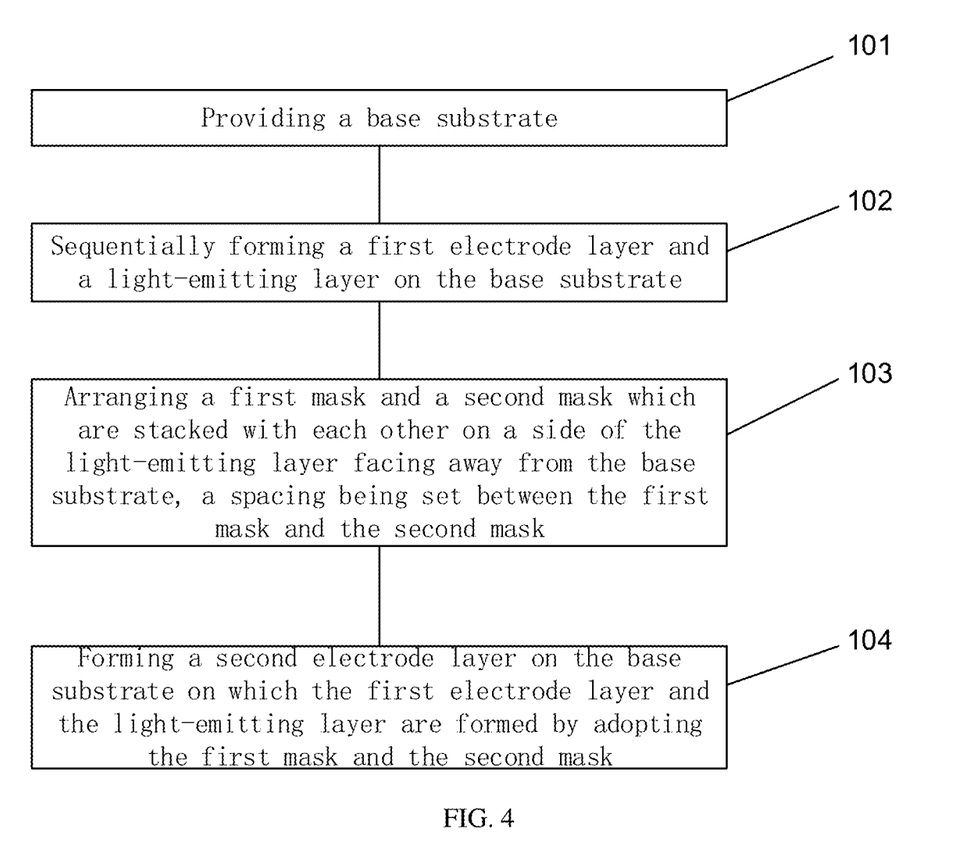
FIG. 4 is a flow chart of a fabrication method of a light-emitting diode structure, as provided by an embodiment of the present disclosure.
Figure 5:
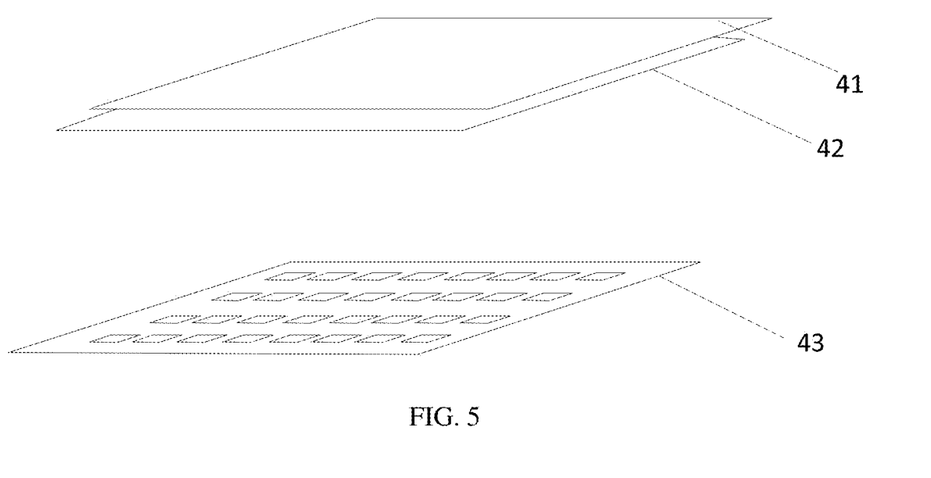
FIG. 5 is a stereogram of a substrate, a first mask and a second mask in a fabrication method of a light-emitting diode structure, as provided by an embodiment of the present disclosure.
Figure 9:
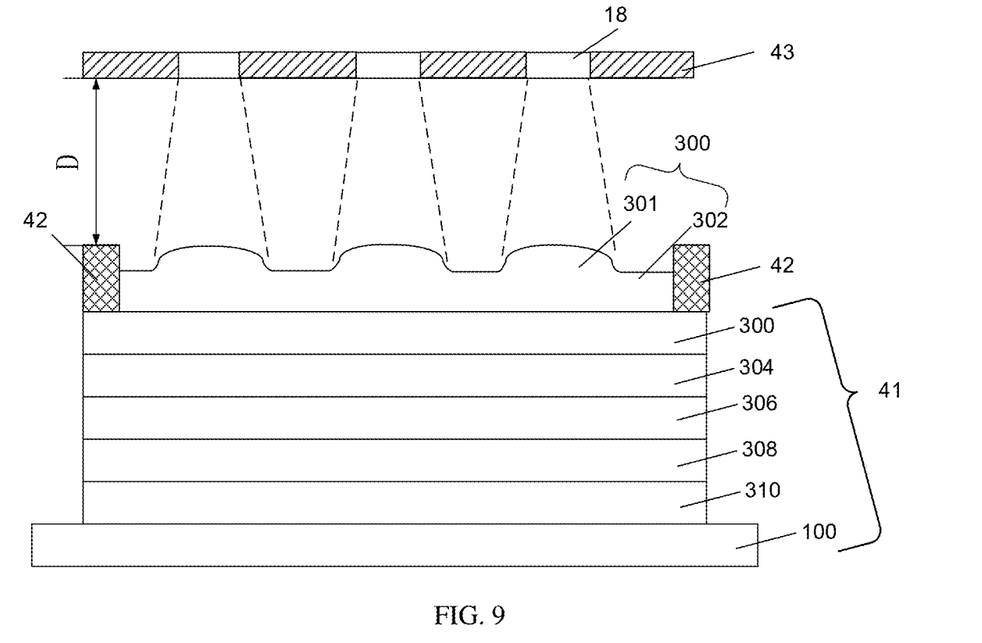
FIG. 9 is a sectional schematic diagram of a substrate, a first mask and a second mask in a fabrication method of a light-emitting diode structure, as provided by an embodiment of the present disclosure.

With reference to FIGS. 4, 5 and 9, an embodiment of the present disclosure provides a fabrication method of a light-emitting diode structure, including:

S101: providing a base substrate 100;

S102: sequentially forming a first electrode layer 310 and a light-emitting layer 306 on the base substrate 100;

S103: arranging a first mask 42 and a second mask 43 which are stacked with each other on a side of the light-emitting layer 306 facing away from the base substrate 100, a spacing D being set between the first mask 42 and the second mask 43; and S104: forming a second electrode layer 300 on the base substrate 100 with the first electrode layer 310 and the light-emitting layer 306 formed, by adopting the first mask 42 and the second mask 43.

The second electrode layer 300 obtained by the fabrication method has a plurality of protrusions 301 formed on a surface thereof on a side away from the base substrate 100, and thus, the surface is a rough surface; after light passes through the rough surface, an incident angle can be changed, and all the light emitted by the light-emitting layer 306 can penetrate the second electrode layer 300 to emerge, so that the luminous efficiency of the display panel can be improved, and the quality of the display apparatus is ensured. In addition, by adopting two masks 42 and 43, the second electrode layer 300 with a plurality of protrusions 301 can be formed in a same one process step, so that a production process is simplified, and fabricating time is shortened.

Figure 6:
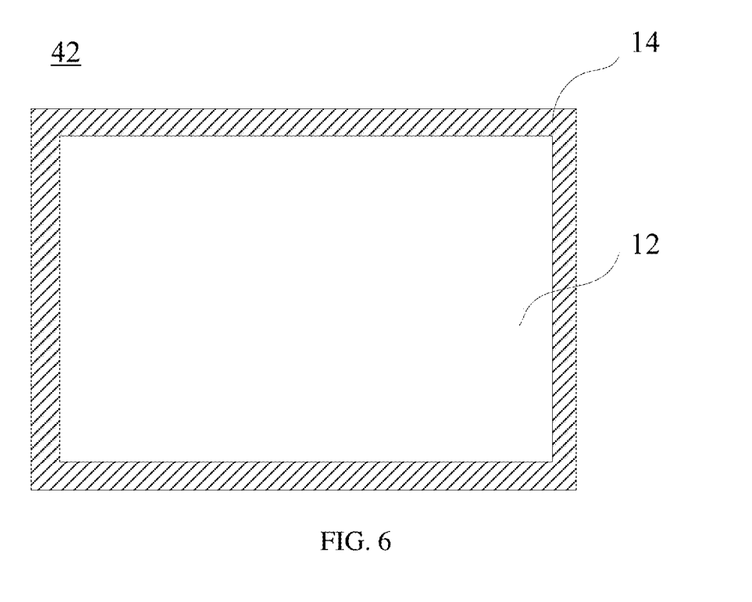
FIG. 6 is a structural schematic structure of a first mask provided by an embodiment of the present disclosure.
Figure 7:
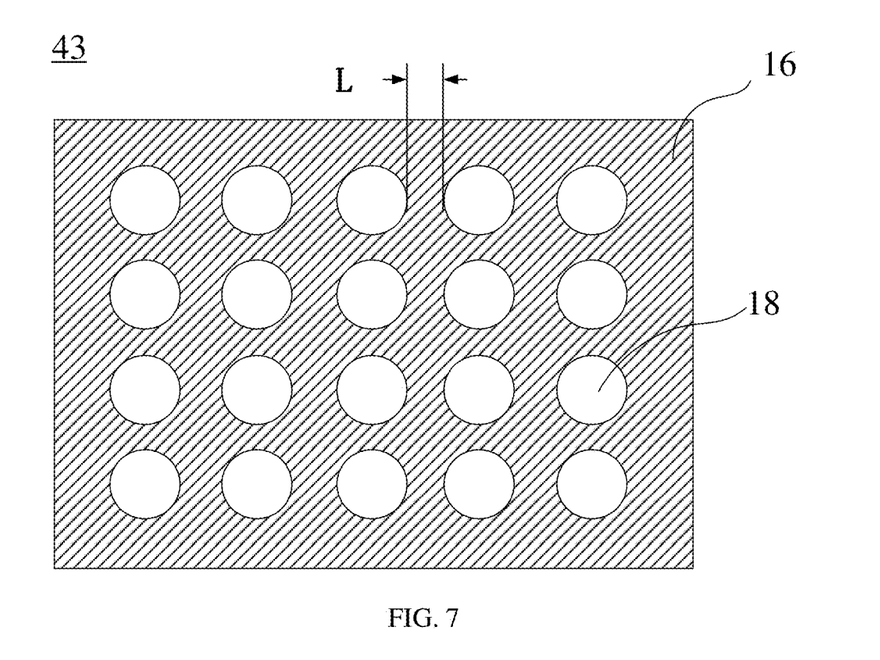
FIG. 7 is a structural schematic structure of a second mask provided by an embodiment of the present disclosure.
Figure 8:
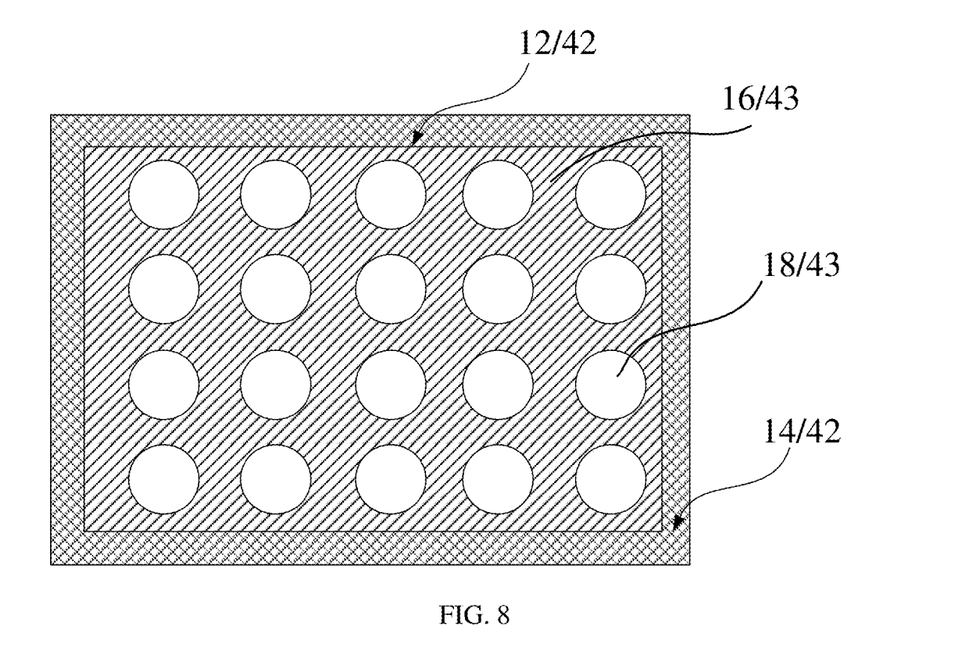
FIG. 8 is a top view of a first mask and a second mask, as provided by an embodiment of the present disclosure.

For example, as shown in FIG. 6 to FIG. 8, the first mask 42 and the second mask 43 have shielding patterns different from each other, so that a part of electrode material passing through the first mask 42 is shielded by the second mask 43. For example, an orthogonal projection of the shielding pattern of the first mask 42 on the second mask 43 is located in the shielding pattern of the second mask 43. Therefore, the first mask 42 can control the second electrode layer 300 to be formed only in a defined region of a substrate. The second mask 43 includes regular opening patterns; for example, in a sputtering process, the electrode material needs to pass through respective opening regions of two masks, so that it is more beneficial for forming the second electrode layer 300 with a plurality of protrusions 301 on the substrate. In this specification, the term "substrate" refers to the base substrate on which one or more electronic elements are formed, and/or one or more functional layers are formed. For example, as shown in FIG. 9, the substrate 41 includes the base substrate 100 and the second electrode layer 300, a first transport layer 304, the light-emitting layer 306, a hole transport layer 308 and the first electrode layer 310 which are formed on the base substrate 100.

For example, as shown in FIG. 6, the first mask 42 includes a first opening 12 and a first shielding portion 14 surrounding the first opening 12. For further example, as shown in FIG. 7, the second mask 43 includes a plurality of second openings 18 and a second shielding portion 16 surrounding each second opening 18. The plurality of second openings 18 of the second mask 43 correspond to the first opening 12 of the first mask 42. Thus, it can be seen that the first shielding portion 14 and the second shielding portion 16 have different patterns. The first shielding portion 14 is located around the first opening 12, and thus, when passing through the first mask 42, a part of the electrode material is shielded by the first shielding portion 14 and cannot reach the substrate 41, and the other part of the electrode material passes through the first opening 12 to reach the substrate 41. Therefore, the first mask 42 effectively controls a region or range on the substrate 41 where the electrode material falls, so as to avoid short circuit caused by a case that the electrode material falls outside the region. Similarly, due to existence of the second shielding portion 16, when the passing through the second mask 43, a part of the electrode material is shielded by the second shielding portion 16, and the other part of the electrode material passes through the second opening 18 and finally reaches the substrate 41 so as to form the second electrode layer 300 with a plurality of protrusions 301.

The amount of the first openings 12 can be one, two or more, and the amount of the first opening 12 can be set according to actual demands. For example, as shown in FIG. 6 and FIG. 8, the first mask 42 includes only one first opening 12, and in this case, orthogonal projections of all of the plurality of second openings 18 of the second mask 43 on a plane where the first mask 42 is located are all located within the first opening 12. When forming the second electrode layer 300, the electrode material passing through a plurality of second openings 18 reaches the substrate 41, and the second electrode layer 300 including a plurality of protrusions 302 is formed on the substrate 41. By arranging the second mask 43, a position of the protrusion 301 on the surface of the second electrode layer 302 can be further controlled so as to benefit for forming the protrusions 301 periodically arranged. For example, in order to further simplify the production process, the plurality of second openings 18 are the same in area with each other and are arranged in an array; a plurality of openings 18 on the same row or the same column can be disposed in an equal spacing or periodic manner. Therefore, in the second electrode layer finally obtained, the protrusions 302 are also distributed in an equal spacing or periodic manner, and are the same in size. It should be understood that in other embodiments of the present disclosure, the plurality of second openings may be different in area from each other, and may also be arranged in other manners except for the equal spacing manner, which all can achieve the objective of the present disclosure.

Figure 10:
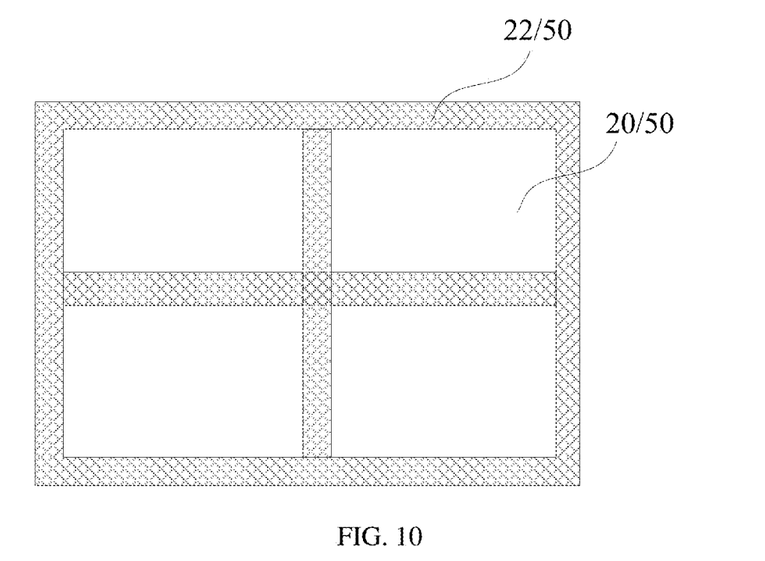
FIG. 10 is a structural schematic diagram of another first mask provided by an embodiment of the present disclosure.

For further example, as shown in FIG. 10, a first mask 50 includes four first openings 20 and a shielding portion 22 surrounding each first opening. Therefore, electrode material passing through the first mask 50 can form part of a second electrode layer in four regions of a substrate, which respectively correspond to the four first openings 20, so as to effectively control a forming range and region of the second electrode layer.

For example, as shown in FIG. 6, forming the second electrode layer 300 on the base substrate 100 on which the first electrode layer 310 and the light-emitting layer 306 are formed by adopting the first mask 42 and the second mask 43 includes: enabling the electrode material to pass through each first opening 12 of the first mask 42 and each second opening 18 of the second mask 43 to reach the substrate so as to form the second electrode layer 300 including a plurality of protrusions 302. For example, each protrusion 302 corresponds to one second opening 18 on the second mask 43. In this step, the material sputtered at the second opening 18 of the second mask 43 is more and has a large thickness so as to form the protrusion 301, while a part of the material can also be sputtered in a region of the substrate 41 corresponding to the second shielding portion 16 around the second opening 18, and this part of sputtered material is less and has a small thickness so as to form a depression 302 around the protrusion 301. Therefore, the second electrode layer 300 with the protrusion 301 and the depression 302 is finally formed. In this embodiment, by cooperative use of the first mask 42 and the second mask 43, the second electrode layer 300 with a plurality of protrusions 301 can be formed on a preset region of the substrate 41 in the same process step. Therefore, by arranging two masks, the second electrode layer with a concave-convex structure can be formed in the same process step, so that the production process is simplified.

In order to avoid a case that in the sputtering process, the material is sputtered into other functional regions of the substrate, in some embodiments, the first mask 42 and the substrate 41 are attached to each other and are in contact with each other.

For example, as shown in FIG. 9, the fabrication method further includes: forming the first transport layer 304 on a side of the light-emitting layer 306 close to the second electrode layer 300, wherein the first mask 42 is attached to the first transport layer 304 and is in contact with the first transport layer 304. In this embodiment, if a gap is formed between the first mask 42 and the first transport layer 304, in the sputtering process, a part of the material can be sputtered into a region of the first transport layer 304 corresponding to a shielding region of the first mask 42 so as to influence quality of a display substrate. In this embodiment, the first mask 42 and the first transport layer 304 are attached to each other and are in contact with each other, so that there is no gap therebetween, thereby improving quality of the display panel.

For example, as shown in FIG. 9, the spacing D is reserved between the second mask 43 and the first mask 42, and the spacing D is within a range of 5 millimeters to 15 millimeters. In this embodiment, if there is no gap between the first mask 42 and the second mask 43, only the protrusion 301 is formed on the substrate 41, but the depression portion 302 cannot be formed.

For example, as shown in FIG. 7, the plurality of second openings 18 of the second mask 43 are arranged in an array, and the plurality of openings 18 are arranged at an equal spacing L. Each second opening 18 is the same in size, is also the same in shape and is of a circle shape. A diameter of the circle is 10 microns to 100 microns and preferably, is 50 microns to 75 microns. It should be understood that the shape of the second opening 18 may also be a regular shape such as a square and a regular polygon, or may be an irregular shape. A section shape of the protrusion on the plane where the base substrate is located is basically the same with the shape of the second opening. For example, as shown in FIG. 2, the section shape of the protrusion 401 on the plane where the base substrate is located is also a circle.

For further example, the second electrode layer 300 is formed by using a magnetron sputtering method. By utilizing double layers of masks to carry out sputtering to form the second electrode layer (i.e., the top electrode), the top electrode with high roughness can be prepared, so that the luminous efficiency of the display panel is improved.

Example 1

A fabrication method for preparing the upright light-emitting diode structure as shown in FIG. 1(a) by adopting double layers of masks includes:

S1: providing a glass substrate;

S2: forming a first electrode layer (for example, a material of the first electrode layer is ITO/Al/ITO) on the glass substrate;

S3: sequentially forming a hole injection layer (PEDOT: PSS), a hole transport layer (TFB), a green quantum dot light-emitting layer and an electron transport layer on the first electrode layer by a spin-coating mode, for example, a material of the electron transport layer being a ZnO nanoparticle layer; and S4: arranging double layers of masks 42 and 43 as shown in FIG. 5 on the ZnO nanoparticle layer, sputtering an IZO material on the ZnO nanoparticle layer to form a second electrode layer with protrusions, wherein as shown in FIG. 7, the second opening of the second mask 43 is of a circle and has a diameter of 60 microns, and the spacing L is 100 microns. The spacing D between two layers of masks 42 and 43 is 10 mm.

Example 2

The same method with that in the above-mentioned example is adopted to carry out production, and the difference is that an ITO material is adopted as the second electrode layer.

Contrast Example 1

The same method with that in the above-mentioned example is adopted to carry out production, and the difference is that metal Ag is adopted as the second electrode layer.

Contrast Example 2

The same method with that in the above-mentioned example is adopted to carry out production, and the difference is that only the first mask 43 is adopted to form the second electrode layer, and that, no protrusion is formed on the second electrode layer.

Figure 11A:
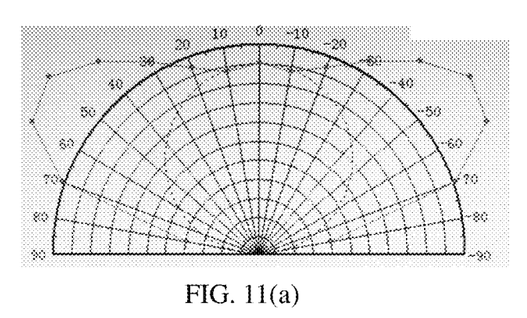
FIG. 11(a) and FIG. 11(b) respectively show distribution diagrams of light emergent brightness of light-emitting diode structures in an example and a contrast example of the present disclosure.
Figure 11B:
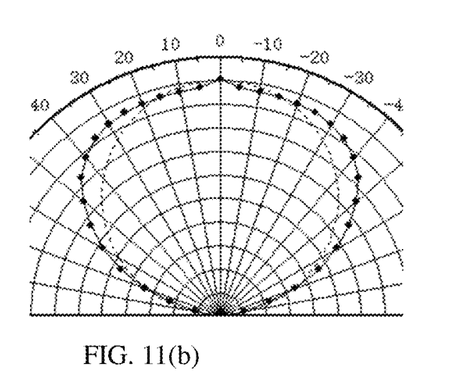

FIG. 11(a) and FIG. 11(b) respectively show distribution of light emergent brightness of the light-emitting diode structures in Example 1 and Contrast Example 1. Numbers in the drawings represent viewing angles, 0 degree represents a front viewing direction, and a positive number or a negative number represent an oblique viewing direction. In FIG. 11(a), the light-emitting diode structure in the example of the present disclosure has relatively high light emergent brightness in the oblique viewing direction, but has relatively small light emergent brightness in the front viewing direction. In FIG. 11(b), the light-emitting diode structure in Contrast Example 1 has relatively small light emergent brightness in the oblique viewing direction, but has relatively large light emergent brightness in the front viewing direction. Thus it can be seen that better light emergent brightness can be obtained in the front viewing direction by using IZO as the transparent top electrode.

Figure 12:
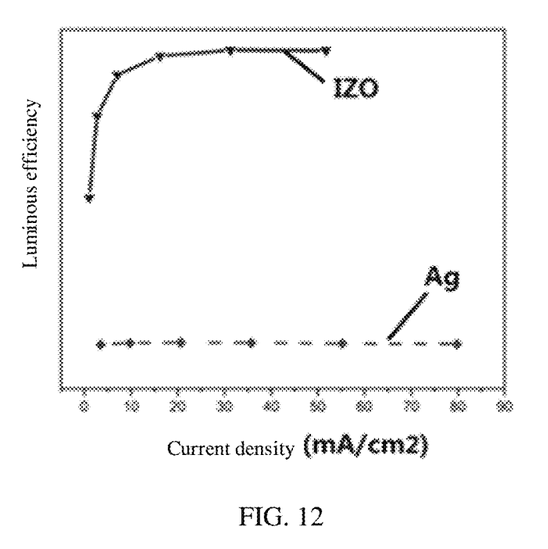
FIG. 12 shows luminous efficiency of the light-emitting diode structures in the example and the contrast example of the present disclosure.

FIG. 12 shows luminous efficiency of the light-emitting diode structures in Example 1 and Contrast Example 1. Thus it can be seen that as a current density is increased, the luminous efficiency of the light-emitting diode structure using the IZO as the transparent top electrode is higher.

Figure 13:
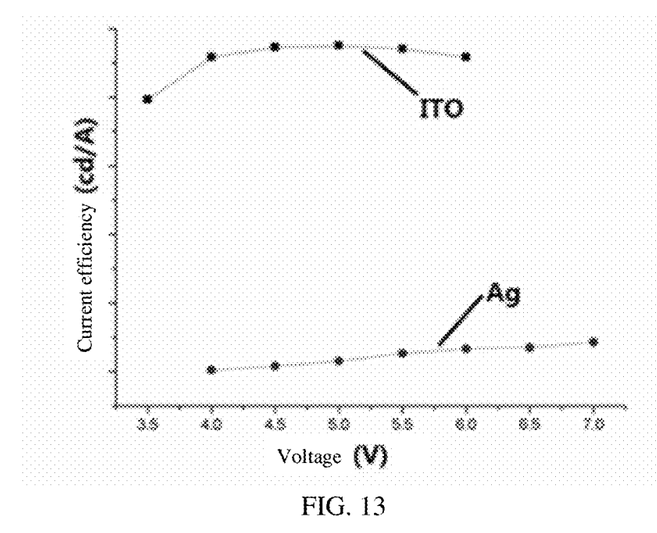
FIG. 13 shows luminous efficiency of light-emitting diode structures in another example and another contrast example of the present disclosure.

FIG. 13 shows luminous efficiency of the light-emitting diode structures in Example 2 and Contrast Example 1. Thus it can be seen that as a voltage is increased, the luminous efficiency of the light-emitting diode structure using the ITO as the transparent top electrode is higher.

Figure 14:
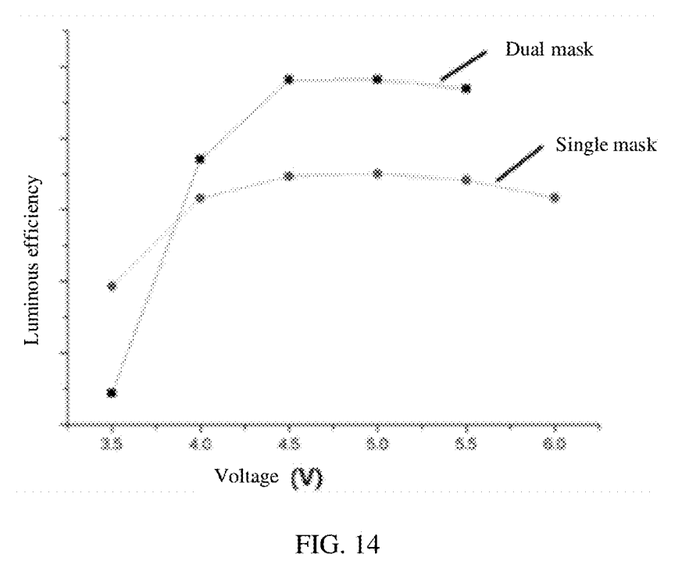
FIG. 14 shows luminous efficiency of light-emitting diode structures in yet another example and yet another contrast example of the present disclosure.

FIG. 14 shows luminous efficiency of the light-emitting diode structures in Example 1 and Contrast Example 2. It can be seen from the drawing that the luminous efficiency of the light-emitting diode structure which is prepared by adopting double layers of masks and the surface of the top electrode of which has the concave-convex structure is higher than that of the light-emitting diode structure which is prepared by adopting one single layer of mask and the surface of the top electrode of which has no concave-convex structure.

Although the present disclosure only provides the fabrication method of the upright light-emitting diode structure as shown in FIG. 1(a), it should be understood that the inverted light-emitting diode structure as shown in FIG. 3 can also be manufactured by adopting double layers of masks, and is not repeated herein.

Herein, some points needs to be explained:

(1) Drawings of the embodiments of the present disclosure only refer to structures related with the embodiments of the present disclosure, and other structures may refer to general design.

(2) For clarity, in the drawings used to describe embodiments of the present disclosure, the thickness of layers or regions is enlarged or reduced, i.e., these drawings are not drawn to actual scale.

(3) In case of no conflict, features in the same embodiment and different embodiments of the present disclosure may be combined with each other.

The foregoing embodiments merely are exemplary embodiments of the present disclosure, and not intended to define the scope of the present disclosure, and the scope of the present disclosure is determined by the appended claims.

The invention claimed is:

1. A fabrication method of a light-emitting diode structure, comprising:
providing a base substrate;
sequentially forming a first electrode layer and a light-emitting layer on the base substrate;
arranging a first mask and a second mask which are stacked with each other on a side of the light-emitting layer facing away from the base substrate, a spacing being set between the first mask and the second mask; and
forming a second electrode layer on the base substrate on which the first electrode layer and the light-emitting layer are formed by adopting the first mask and the second mask,
wherein the first mask includes at least one first opening and a first shielding portion surrounding the at least one first opening, the second mask includes a plurality of second openings and a second shielding portion surrounding the plurality of second openings, and orthogonal projections of the plurality of second openings on the first mask are located within the at least one first opening,
forming the second electrode layer on the base substrate on which the first electrode layer and the light-emitting layer are formed by adopting the first mask and the second mask includes:
enabling the electrode material to sequentially pass through each second opening of the second mask and the at least one first opening of the first mask so as to form the second electrode layer, a plurality of protrusions being formed on the surface of the second electrode layer away from the base substrate.

2. The fabrication method according to claim 1, wherein the first mask and the second mask have shielding patterns different from each other, so that a part of an electrode material passing through the first mask is shielded by the second mask.

3. The fabrication method according to claim 1, wherein the plurality of second openings are arranged in an array mode, and a size of each second opening is 10 microns to 100 microns.

4. The fabrication method according to claim 1, further comprising:

forming a first transport layer on a side of the light-emitting layer close to the second electrode layer, wherein the first mask is attached to the first transport layer and is in contact with the first transport layer.

5. The fabrication method according to claim 1, wherein the spacing between the first mask and the second mask is 5 millimeters to 15 millimeters.

6. The fabrication method according to claim 1, wherein the second electrode layer is formed by a magnetron sputtering method.

* * * * *